(12) United States Patent
Chen et al.

(10) Patent No.: US 7,774,932 B2
(45) Date of Patent: Aug. 17, 2010

(54) CIRCUIT BOARD PROCESS

(75) Inventors: Chun-Chien Chen, Taipei (TW); Tsung-Yuan Chen, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 677 days.

(21) Appl. No.: 11/759,941

(22) Filed: Jun. 8, 2007

(65) Prior Publication Data
US 2008/0196934 A1     Aug. 21, 2008

(30) Foreign Application Priority Data
Feb. 16, 2007     (TW) ............................... 96106080 A

(51) Int. Cl.
*H01K 3/10* (2006.01)
(52) U.S. Cl. ............................. 29/852; 29/830; 29/831; 174/262
(58) Field of Classification Search ................. 29/830, 29/831, 846, 847, 852; 174/262; 205/216; 216/17, 18
See application file for complete search history.

(56) References Cited

U.S. PATENT DOCUMENTS

| 6,240,636 B1 * | 6/2001 | Asai et al. ...................... 29/852 |
| 6,739,040 B1 * | 5/2004 | Nakamura et al. ............ 29/846 |
| 6,779,262 B1 * | 8/2004 | Gales et al. ................... 29/852 |

* cited by examiner

*Primary Examiner*—Donghai D. Nguyen
(74) *Attorney, Agent, or Firm*—Jianq Chyun IP Office

(57) ABSTRACT

A circuit board process is provided. First, multiple carriers is provided, and a first conductive layer having multiple concave structures is formed on each carrier. A dielectric layer is then provided, and the carriers with the first conductive layers are laminated on a first and a second surface of the dielectric layer respectively, wherein portions of the first conductive layers are embedded in the first and second surfaces. Next, the carriers are removed. Thereafter, the first conductive layer corresponding to at least one concave is removed to expose a portion of the dielectric layer. Next, the exposed dielectric layer is removed to form an opening. A second conductive layer is then formed on the inner wall of the opening, wherein the second conductive layer is electrically connected to the first conductive layers on both sides of the dielectric layer.

12 Claims, 9 Drawing Sheets

US 7,774,932 B2

CIRCUIT BOARD PROCESS

CROSS-REFERENCE TO RELATED APPLICATION

This application claims the priority benefit of Taiwan application serial no. 96106080, filed Feb. 16, 2007. All disclosure of the Taiwan application is incorporated herein by reference.

BACKGROUND OF THE INVENTION

1. Field of the Invention

The present invention generally relates to a circuit board process, and more particularly, to a circuit board process with embedded circuit.

2. Description of Related Art

In recent years, along with the rapid advancement of fabrication techniques in electronic industry, circuit boards can be designed for carrying various small-volume electronic components to be applied to various electronic products. FIGS. 1A~1H are cross-sectional views illustrating a conventional circuit board process. The conventional circuit board process includes following steps. First, as shown in FIG. 1A, a laminate 110 is provided, wherein the laminate 110 has a core layer 112 and a copper foil layer 114 on each side of the core layer 112. Next, as shown in FIG. 1B, a patterning process is performed to the copper foil layer 114 on each side of the core layer 112 to form a first circuit layer 114' respectively. Thereafter, as shown in FIGS. 1C~1D, a dielectric layer 120 and a copper foil 130 are laminated on each side of the laminate 110, wherein the dielectric layer 120 is laminated between the core layer 112 and the copper foil 130.

After laminating the dielectric layer 120 and the copper foil 130 on each side of the core layer 112, an opening 140 is formed on the copper foil layer 130 at each side of the core layer 112 to expose a portion of the dielectric layer 120, as shown in FIG. 1E. Thereafter, as shown in FIG. 1F, the dielectric layer 120 exposed by the openings 140 is removed to form another opening 150 for exposing the first circuit layer 114'. Thereafter, as shown in FIG. 1G, plating copper is filled into the opening 150 and the opening 140 through an electroplating process to form a conductive hole 160. Next, as shown in FIG. 1H, a photolithography process is performed on a portion of the plating copper in the copper foil layer 130 and the conductive hole 160 to form a second circuit layer 130' on the dielectric layer 120. Thus, the fabrication of the circuit board 100 is completed, and the second circuit layer 130' may be electrically connected to the first circuit layer 114' through the conductive hole 160.

It shall be noted that in the conventional technique described above, the disposition of the conductive hole 160 and the second circuit layer 130' are defined in different steps. To be specific, an alignment process is first performed while fabricating the conductive hole 160 in order to form the conductive hole 160 at a predetermined position, and another alignment process has to be performed while fabricating the second circuit layer 130' in order to form the second circuit layer 130' at a predetermined position. Thus, the conventional technique requires several alignment processes for defining the dispositions of the conductive hole 160 and the second circuit layer 130', which reduces circuit fabrication efficiency on the circuit board. Besides, since the conductive hole 160 and the second circuit layer 130' are defined on the circuit board 100 respectively through different alignment processes, the conductive hole 160 and the second circuit layer 130' may not be defined accurately at predetermined dispositions thereof under the affection of the process tolerance, therefore the alignment accuracy of the circuit on the conventional circuit board is reduced greatly.

On the other hand, in a circuit board fabricated by the conventional technique, there is only one contact surface between the circuit layer and the dielectric layer, therefore the circuit layer and the dielectric layer may not be bonded tightly and accordingly the reliability of the circuit on the circuit board may be adversely affected.

SUMMARY OF THE INVENTION

Accordingly, the present invention is directed to a circuit board process for improving the fabrication efficiency on a circuit board.

According to another aspect of the present invention, a circuit board process is provided for improving the alignment accuracy on a circuit board.

According to yet another aspect of the present invention, a circuit board process is provided for improving the circuit reliability on a circuit board.

To achieve aforementioned and other objectives, the present invention provides a circuit board process including following steps. First, a plurality of first carriers is provided, and a first conductive layer is formed on each of the first carriers, wherein the first conductive layer has a plurality of first concave structures. A first dielectric layer is then provided, wherein the first dielectric layer has a first surface and a second surface. Next, the first carriers with the first conductive layers are respectively laminated upon the first and the second surface of the first dielectric layer, wherein the first conductive layers are respectively located between the first dielectric layer and the first carriers, and portions of the first conductive layers are embedded in the first and the second surface of the first dielectric layer. Next, the first carriers are removed. The first conductive layer corresponding to at least one of the first concave structures is then removed to expose portion of the first dielectric layer. Next, the first dielectric layer exposed by the first conductive layer is removed to form a first opening. Next, a second conductive layer is formed on the inner wall of the first opening, wherein the second conductive layer is electrically connected to the first conductive layers located at both sides of the first dielectric layer. Thereafter, the first conductive layers on the first and the second surface are removed.

According to an embodiment of the present invention, the method for forming a first conductive layer on a first carrier includes the following steps. First, a first metal layer is formed on each of the first carriers. Next, a first patterned photoresist layer is formed on the first metal layer, wherein the first patterned photoresist layer exposes a portion of the first metal layer. Next, a first circuit layer is formed on the first metal layer exposed by the first patterned photoresist layer, and the first conductive layer includes the first metal layer and the first circuit layer. Next, the first patterned photoresist layer is removed to form the first concave structures on the first conductive layer.

According to an embodiment of the present invention, the first concave structures are annular concave structures.

According to an embodiment of the present invention, the step for forming the first circuit layer includes an electroplating process.

According to an embodiment of the present invention, the step for forming the first patterned photoresist layer includes an exposure and development process.

According to an embodiment of the present invention, the step for forming the first opening includes laser manufacturing, mechanical drilling, or chemical etching.

According to an embodiment of the present invention, following steps are further performed after forming the second conductive layer on the inner wall of the first opening. First, a conductive material is filled in the first opening to form a conductive pole. Next, the first conductive layers on the first and the second surface and the conductive material outside of the first opening are removed.

According to an embodiment of the present invention, following steps are further performed after removing the first conductive layers on the first and the second surface and the conductive material outside of the first opening. First, a plurality of second carriers is provided, and a third conductive layer is formed on each of the second carriers, wherein the third conductive layer has a plurality of second concave structures. Next, a second dielectric layer and a second carrier with the third conductive layer are laminated on the first and the second surface of the first dielectric layer respectively, wherein each of the second dielectric layer is located between the second carrier and the first dielectric layer, and a portion of the third conductive layer is embedded in the second dielectric layer. Next, the second carriers are removed. Thereafter, the third conductive layer corresponding to at least one of the second concave structures is removed to expose a portion of the second dielectric layer. Next, the second dielectric layer exposed by the third conductive layer is removed to form a second opening. Next, a fourth conductive layer is formed on the inner wall of the second opening, wherein the fourth conductive layer is electrically connected to the first conductive layer embedded in the first dielectric layer and the third conductive layer embedded in the second dielectric layer. Next, the third conductive layer on the surface of the second dielectric layer is removed.

According to an embodiment of the present invention, the step for forming the second opening includes laser manufacturing, mechanical drilling, or chemical etching.

According to an embodiment of the present invention, following steps are further performed after forming the fourth conductive layer on the inner wall of the second opening. First, a hole-filling material is filled in the second opening. Next, the second conductive layer on the surface of the second dielectric layer and the hole-filling material outside of the second opening are removed.

According to an embodiment of the present invention, the hole-filling material includes a conductive material or an insulating material.

According to an embodiment of the present invention, the second concave structures are annular concave structures.

According to the present invention, the dispositions of a circuit layer and a conductive hole are defined in the same process. Compared to conventional techniques, less numbers of alignment process are required for defining the dispositions of the conductive hole and the circuit layer, therefore the circuit fabrication efficiency can be effectively increased. Moreover, since the dispositions of the circuit layer and the conductive hole are defined in the same process, the alignment accuracy regarding the relative positions between the conductive hole and the circuit may be unaffected by the process tolerance.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
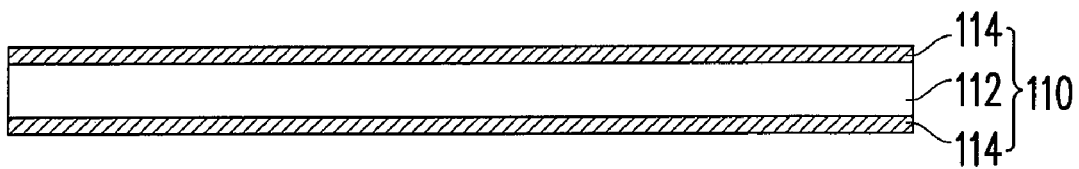
FIGS. 1A~1H are cross-sectional views illustrating a conventional circuit board process.
Figure 1B:
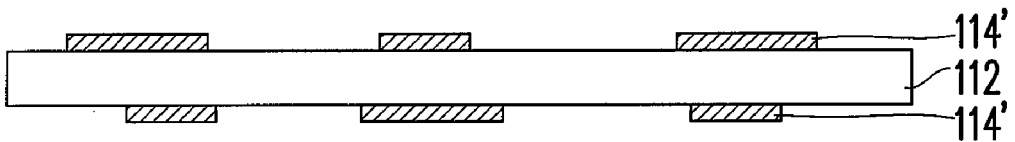
Figure 1C:
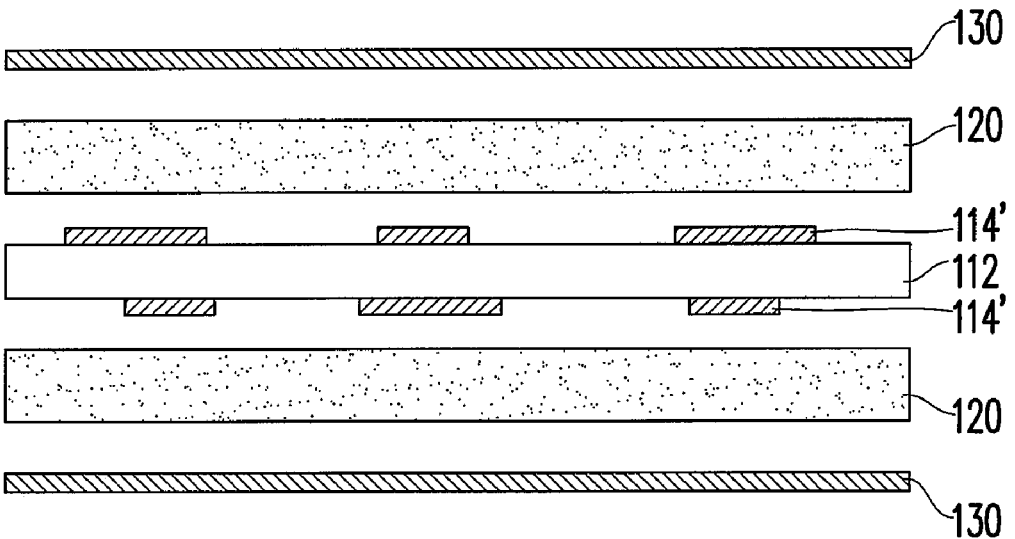
Figure 1D:
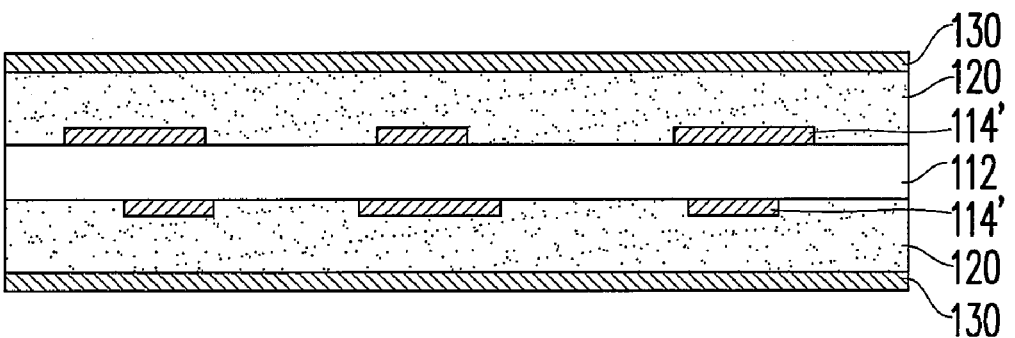
Figure 1E:
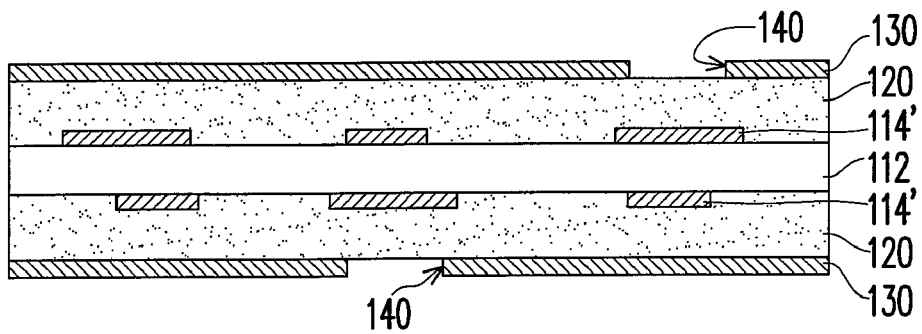
Figure 1F:
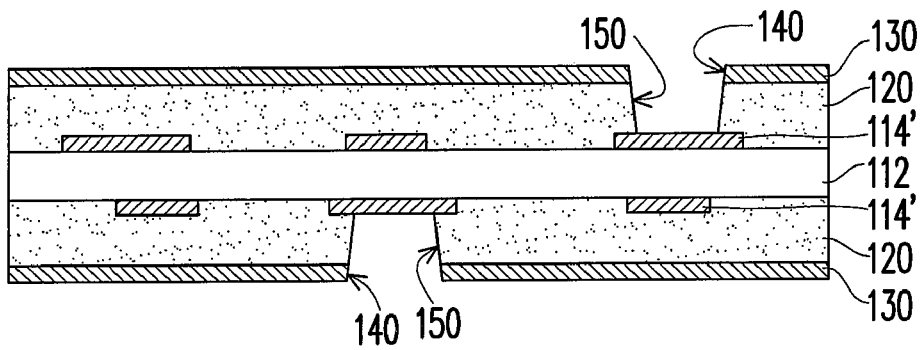
Figure 1G:
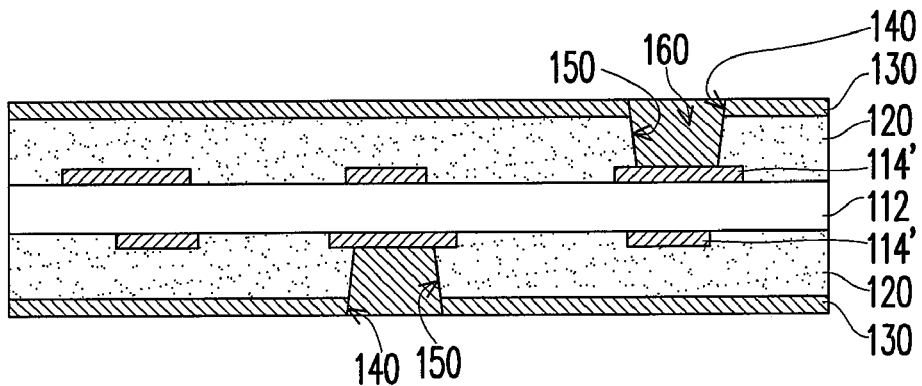
Figure 1H:
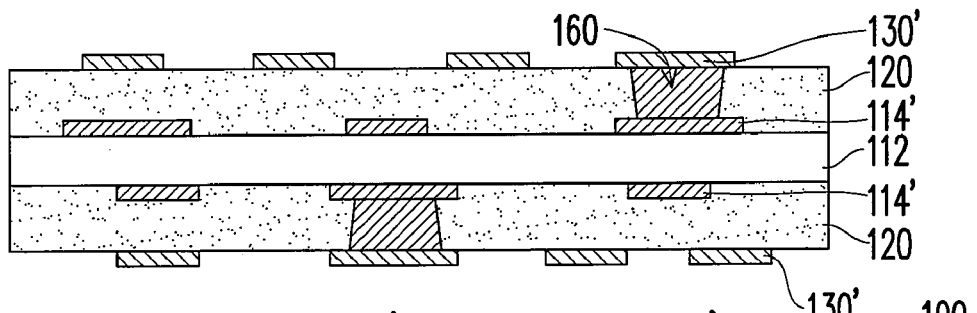

Reference will now be made in detail to the present preferred embodiments of the invention, examples of which are illustrated in the accompanying drawings. Wherever possible, the same reference numbers are used in the drawings and the description to refer to the same or like parts.

Figure 2:
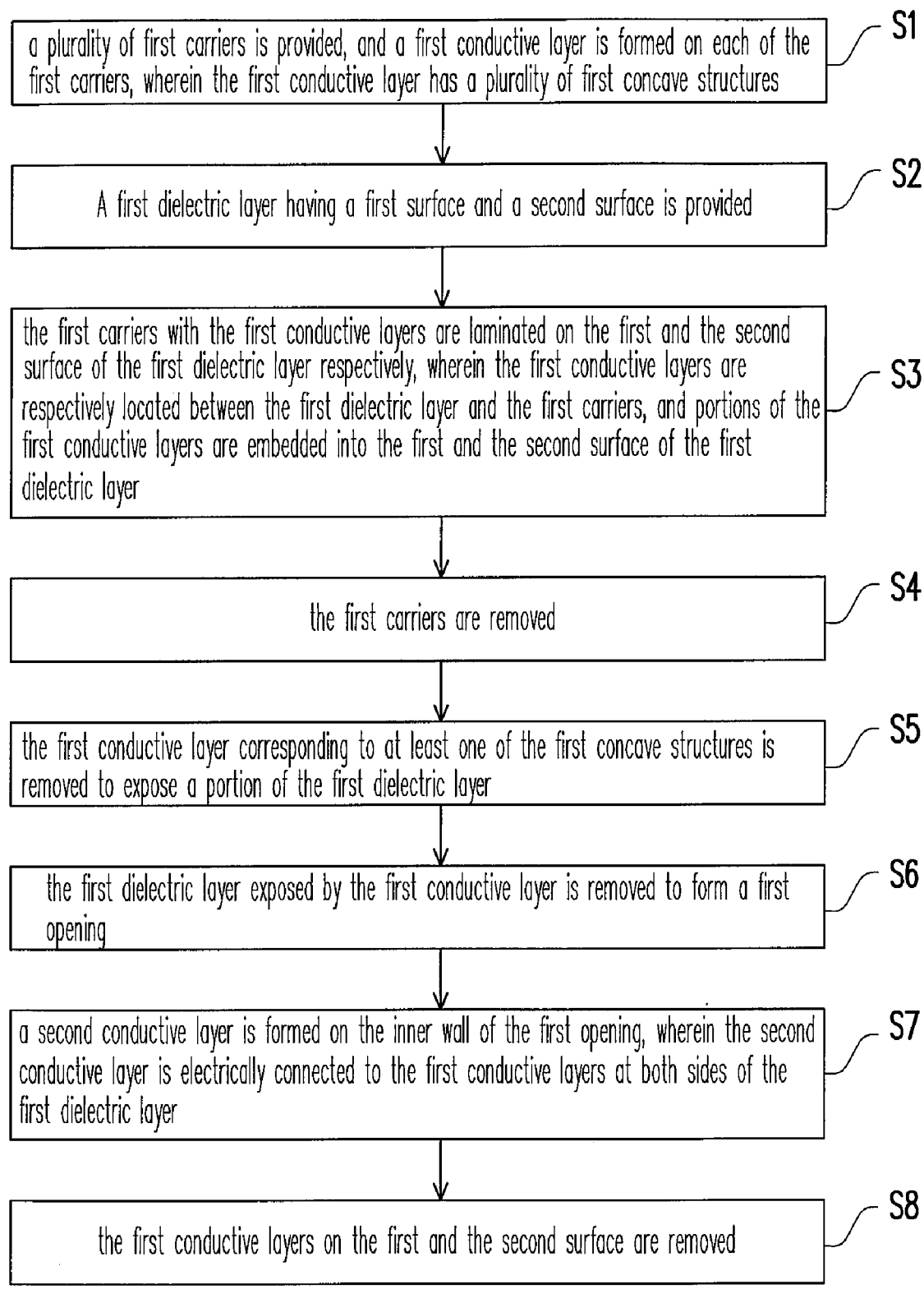
FIG. 2 is a flowchart illustrating a circuit board process according to an exemplary embodiment of the present invention.

FIG. 2 is a flowchart illustrating a circuit board process according to an exemplary embodiment of the present invention. Referring to FIG. 2, the circuit board process in the present embodiment includes following steps. First, in step S1, a plurality of first carriers is provided, and a first conductive layer is formed on each of the first carriers, wherein the first conductive layer has a plurality of first concave structures. A first dielectric layer having a first surface and a second surface is then provided in step S2. Next, in step S3, the first carriers with the first conductive layers are laminated on the first and the second surface of the first dielectric layer respectively, wherein the first conductive layers are respectively located between the first dielectric layer and the first carriers, and portions of the first conductive layers are embedded into the first and the second surface of the first dielectric layer.

After step S3, the first carriers are removed in step S4. Thereafter, in step S5, the first conductive layer corresponding to at least one of the first concave structures is removed to expose a portion of the first dielectric layer. Next, the first dielectric layer exposed by the first conductive layer is removed to form a first opening in step S6. Next, in step S7, a second conductive layer is formed on the inner wall of the first opening, wherein the second conductive layer is electrically connected to the first conductive layers at both sides of the first dielectric layer. Next, the first conductive layers on the first and the second surface are removed in step S8. Hereinafter, the circuit board process according to the present embodiment will be described with reference to detailed cross-sectional drawings.

Figure 3A:
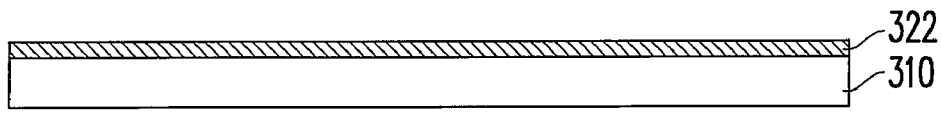
FIGS. 3A~3L are cross-sectional views illustrating the circuit board process in FIG. 2.
Figure 3B:
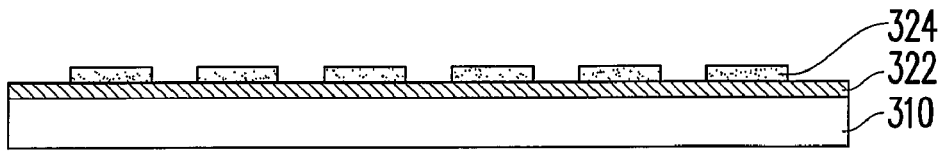

FIGS. 3A~3L are cross-sectional views illustrating the circuit board process in FIG. 2. The circuit board process is described below. First, as shown in FIGS. 3A~3D, a plurality of first carriers 310 is provided, and each of the first carriers 310 has a first conductive layer 320, wherein the first conductive layer 320 has a plurality of first concave structures 320a (in the present embodiment, only one first carrier 310 having a first conductive layer 320 is illustrated demonstratively in FIGS. 3A~3D). The process for forming a first conductive layer 320 on a first carrier 310 is described below. Referring to FIG. 3A, first, a first metal layer 322 is formed on the first carrier 310, by performing, for example but not limited to, an electroplating process or other suitable process. Next, as shown in FIG. 3B, a first patterned photoresist layer 324 is formed on the first metal layer 322, by, for example but not limited to, forming a photoresist layer on the first metal layer 322 by coating and drying a liquid film or by adhering a photoresist film, and then performing an exposure and development process to the photoresist layer. The first patterned photoresist layer 324 exposes a portion of the first metal layer 322. Certainly, the first patterned photoresist layer 324 may also be printed or formed by other suitable means on the first metal layer 322, which is not limited by the present invention.

Figure 3C:
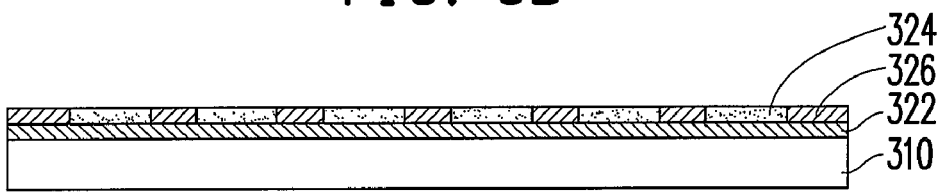
Figure 3D:
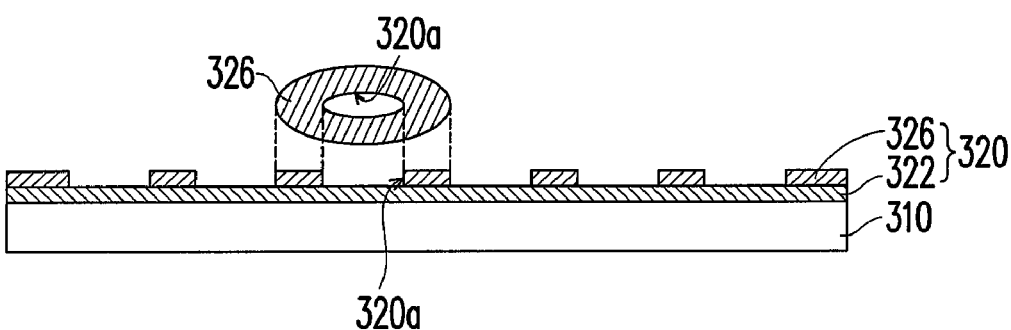

After forming the first patterned photoresist layer 324 on the first metal layer 322, a first circuit layer 326 is then formed on the first metal layer 322 exposed by the first patterned photoresist layer 324, as shown in FIG. 3C. In the present embodiment, the step for forming the first circuit layer 326 may include, for example, an electroplating process, an electrolytic deposition, a physical deposition, a chemical deposition, a sputtering, or other suitable processes, and the first conductive layer 320 includes the first metal layer 322 and the first circuit layer 326. Next, as shown in FIG. 3D, the first patterned photoresist layer 324 is removed. Accordingly, the first conductive layer 320 having a plurality of first concave structures 320a is formed on the first carrier 310. FIG. 3D also illustrates a vertical view of the first concave structures 320a. As shown in FIG. 3D, these first concave structures 320a may be annular concave structures.

Figure 3E:
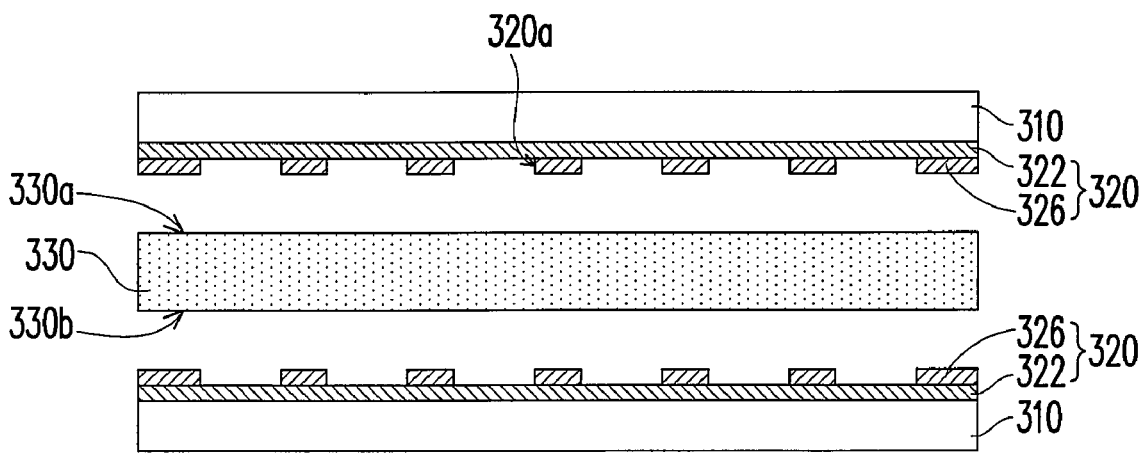
Figure 3F:
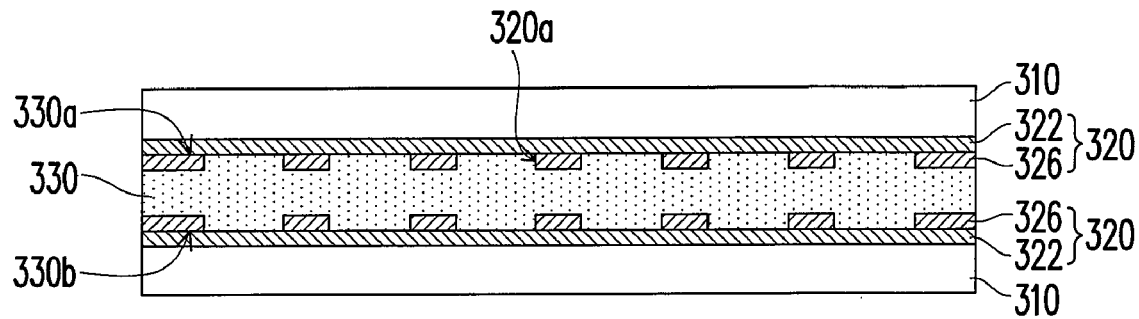
Figure 3G:
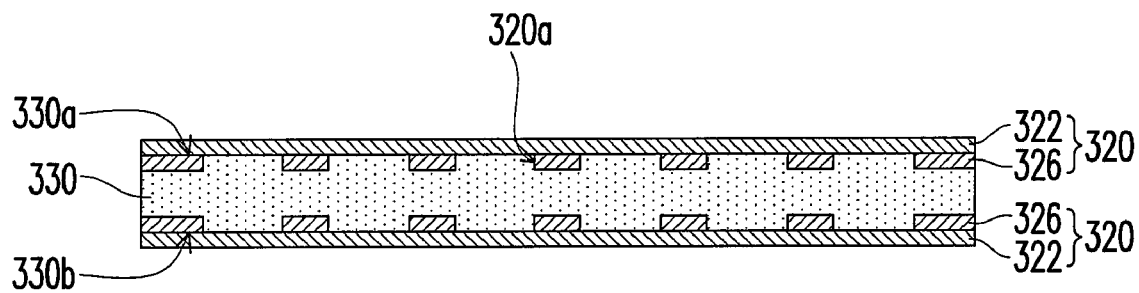

As described above, after fabricating the first conductive layer 320, a first dielectric layer 330 is provided, and the first carriers 310 having the first conductive layers 320 are laminated on the first surface 330a and the second surface 330b of the first dielectric layer 330 respectively as shown in FIGS. 3E~3F. In the present embodiment, the first conductive layer 320 is located between the first dielectric layer 330 and the first carrier 310, and a portion of the first conductive layer 320 is embedded in the first surface 330a and the second surface 330b of the first dielectric layer 330. In the present embodiment, lamination, build up, or other suitable methods may be used for laminating the first conductive layer 320 on the dielectric layer 330 and embedding portions thereof in the first surface 330a and the second surface 330b of the first dielectric layer 330. To be specific, the first circuit layer 326 of the first conductive layer 320 is embedded in the dielectric layer 330, and the first concave structures 320a are filled with conductive material. Next, as shown in FIG. 3G, the first carriers 310 for carrying the first conductive layers 320 are removed.

Figure 3H:
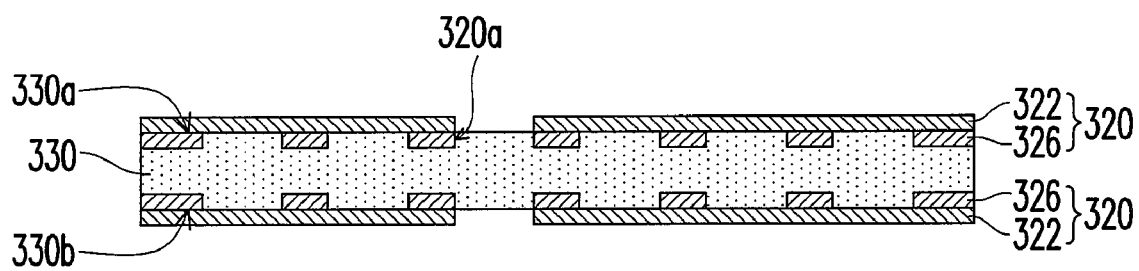
Figure 3I:
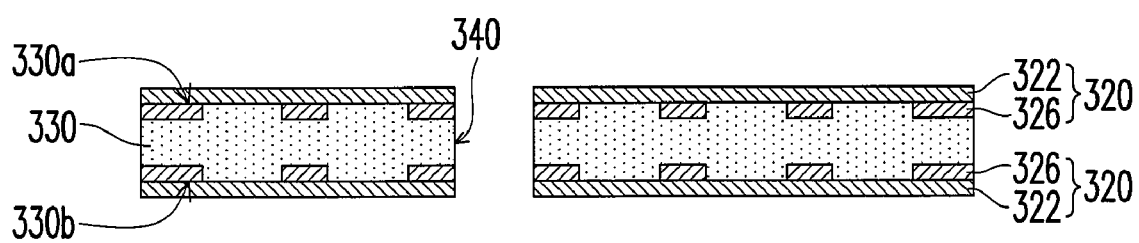

After removing the first carriers 310, the first conductive layer 320 corresponding to a first concave structure 320a is then removed to expose a portion of the first dielectric layer 330, as shown in FIG. 3H. In the present embodiment, the first concave structure 320a is previously formed on the first conductive layer 320, so that the first conductive layer 320 corresponding to the first concave structure 320a can be removed through alignment technique. The first conductive layer 320 corresponding to the first concave structure 320a may be removed through laser manufacturing. Next, as shown in FIG. 3I, the first dielectric layer 330 exposed by the first conductive layer 320 is removed through laser manufacturing technique (IV laser or CO2 laser manufacturing) in order to form a first opening 340. Besides laser manufacturing, the first opening 340 may also formed through mechanical drilling, laser ablation, chemical etching, etc.

Figure 3J:
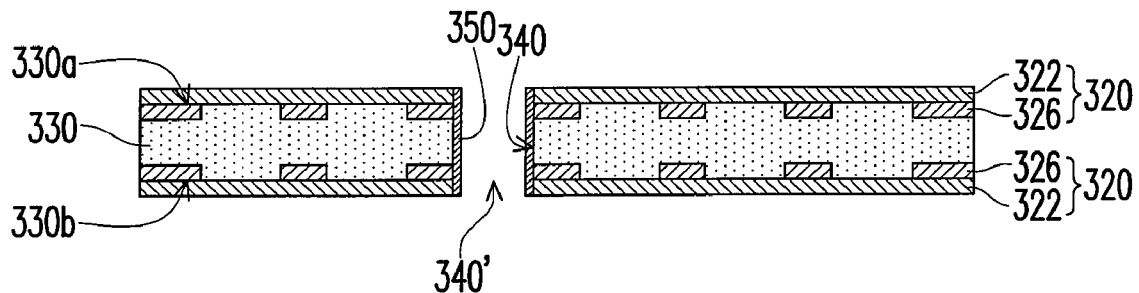

Next, as shown in FIG. 3J, a second conductive layer 350 is formed on the inner wall of the first opening 340 for electrically connecting the first conductive layers 320 on both sides of the first dielectric layer 330. Thus, the fabrication of the first conductive hole 340' is completed. For example, the first conductive hole 340' may be a conductive through hole or a conductive blind via, and a conductive through hole is illustrated in FIG. 3J as an example for the first conductive hole 340'. In addition, even though only one first conductive hole 340' is illustrated in FIG. 3J, a plurality of first conductive holes 340' may also be added in other exemplary embodiments of the present invention according to the design requirement, and the number of first conductive holes 340' is not limited by the present invention.

Figure 3K:
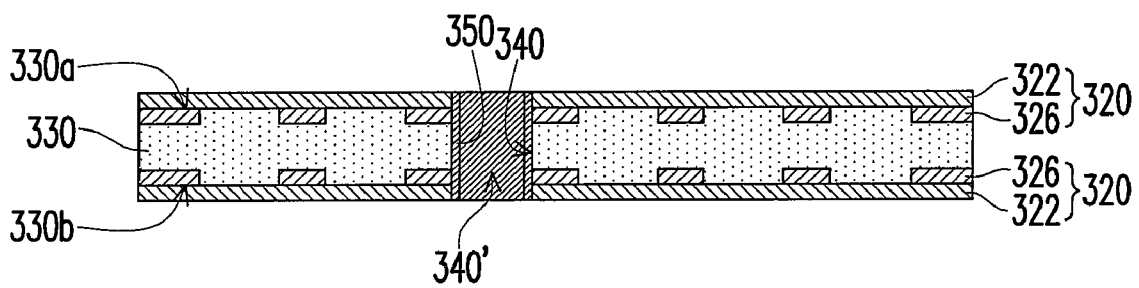

In addition, after completing the fabrication of the first conductive hole 340', a conductive material is filled in the first opening 340 through an electroplating process or other suitable processes (the conductive material may be filled into the first opening 340 through hole-filling electroplating, electrolytic deposition, chemical deposition, vapor deposition, sputtering, or other suitable methods) in order to form a conductive pole (as shown in FIG. 3K) of such material (for example, copper) and further to prevent popcorn effect caused by vapor in the surrounding environment entering the first opening 340.

Figure 3L:
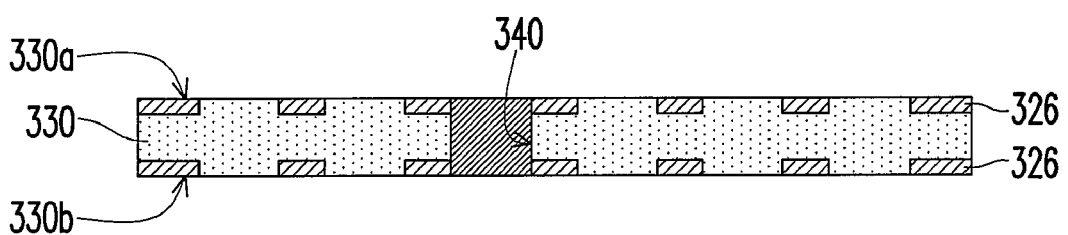

After filling the conductive material into the first opening 340, the first conductive layers 320 (i.e. the first metal layer 322) on the first surface 330a and the second surface 330b and the conductive material outside of the first opening 340 are removed, as shown in FIG. 3L. Thus, the fabrication of the circuit board 300 according to the present embodiment is completed. After removing the first conductive layers 320 on the first surface 330a and the second surface 320b, the first circuit layer 326 is embedded in the first dielectric layer 330, namely, the external surfaces of the first circuit layer 326 are respectively coplanar with the first surface 330a and the second surface 330b of the first dielectric layer 330.

Certainly, in other exemplary embodiments of the present invention, an insulating material (for example, ink) may also be filled in the first conductive hole 340' for preventing the popcorn effect described above. After filling the insulation material in the first conductive hole 340', a conductive cap (not shown) may be respectively disposed at two ends of the first conductive hole 340' so that the first conductive hole 340' can be electrically connected to other conductive through holes or conductive blind vias in subsequent processes.

It shall be noted that in the circuit board 300 of the present embodiment, the first circuit layer 326 is embedded in the first surface 330a and the second surface 330b of the dielectric layer 330; namely, the circuit board 300 in the present embodiment is an embedded circuit board. In addition, in the present embodiment, the disposition of the first conductive hole 340' (i.e. the position of the first concave structure 320a) and the disposition of the first circuit layer 326 are defined at the same time while fabricating the first conductive layer 320. Thus, compared to the conventional technique, the present invention requires less numbers of alignment processes for defining the dispositions of the first conductive hole 340' and the first circuit layer 326. Moreover, since the dispositions of the first circuit layer 326 and the first conductive hole 340' are defined at the same time while fabricating the first conductive layer 320, the first circuit layer 326 and the first conductive hole 340' can be accurately disposed at the predetermined dispositions The circuit board process described in foregoing embodiment is a process of a double-layer circuit board, while in other embodiments of the present invention, a four-layer circuit board or other multiple-layer circuit board may also be fabricated through lamination, build-up, or other suitable methods with the circuit board 300 as a core substrate. Below, the fabricating process of a four-layer circuit board will be described.

Figure 4A:
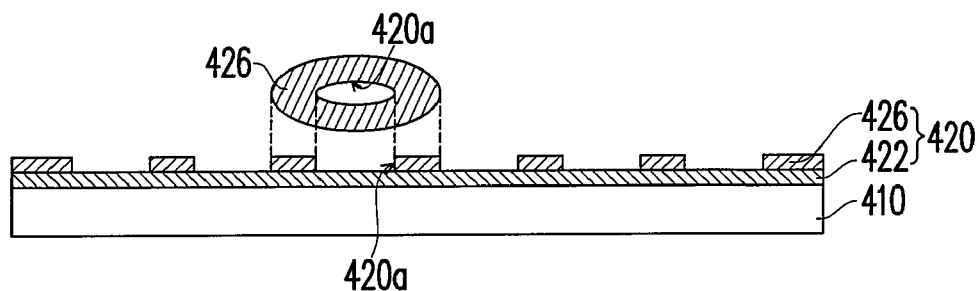
FIGS. 4A~4I are cross-sectional views illustrating a 4-layer circuit board process according to an exemplary embodiment of the present invention.
Figure 4B:
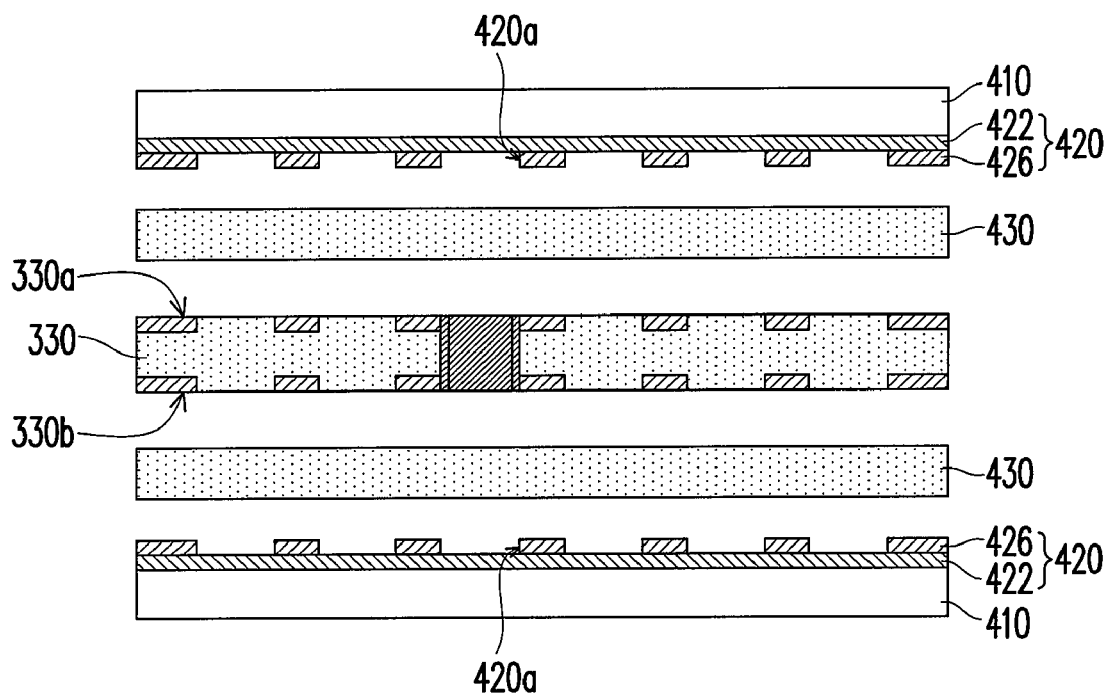
Figure 4C:
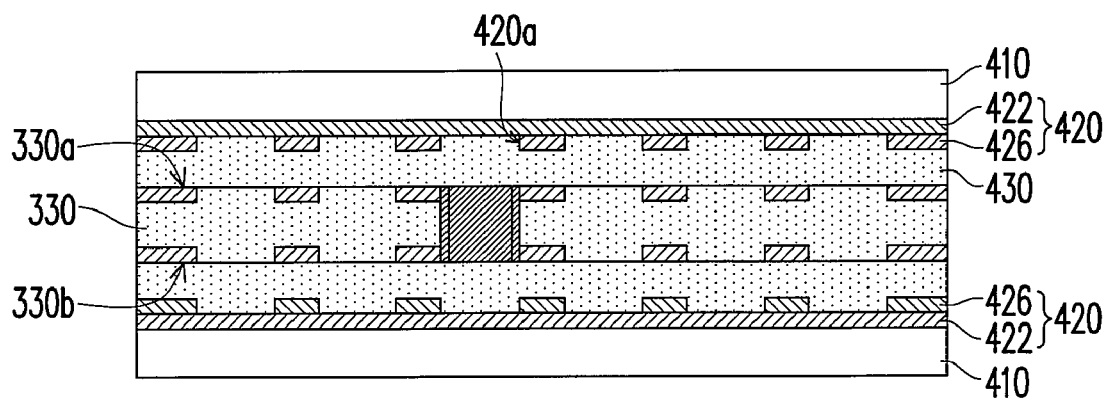

FIGS. 4A~4I are cross-sectional views illustrating a four-layer circuit board process according to an exemplary embodiment of the present invention. Referring to FIGS. 4A~4I, the process includes following steps. First, as shown in FIG. 4A, a plurality of second carriers 410 is provided, and a third conductive layer 420 having a plurality of second concave structures 420a is formed on each of the second carriers 410, wherein these second concave structures 420a may be annular concave structures. The formation method of the third conductive layer 420 (which is composed of a second metal layer 422 and a second circuit layer 426) is the same as that of the first conductive layer 320 in FIG. 3D, therefore description thereof will not be repeated. Next, as shown in FIGS. 4B~4C, a second dielectric layer 430 and a second carrier 410 with the third conductive layer 420 are laminated on the first surface 330a and the second surface 330b of the first dielectric layer 330 respectively. Each of the second dielectric layers 430 is located between the second carrier 410 and the first dielectric layer 330, and a portion of the third conductive layer 420 (i.e. the second circuit layer 426) is embedded in the second dielectric layer 430.

Figure 4D:
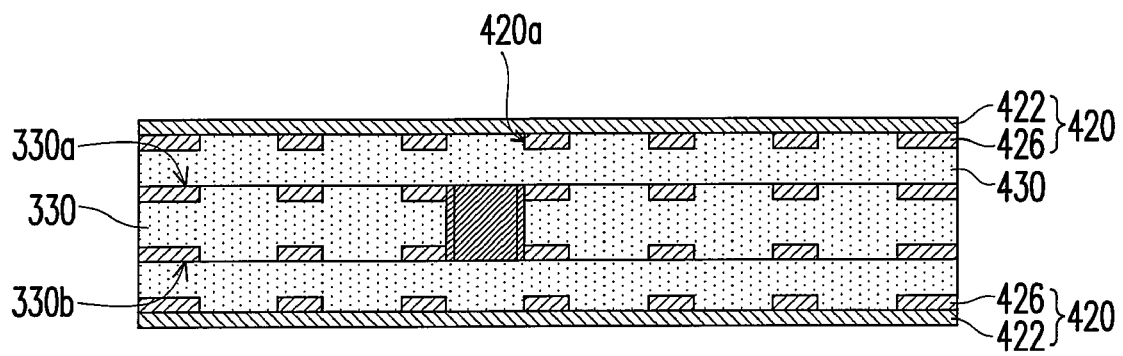
Figure 4E:
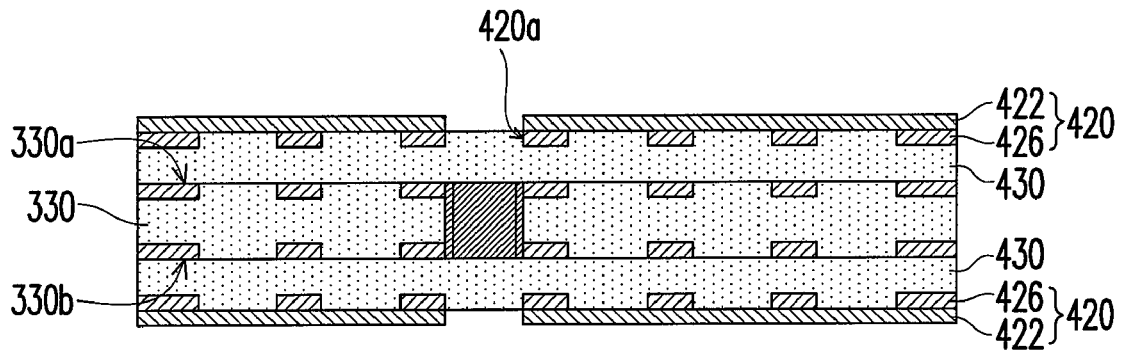
Figure 4F:
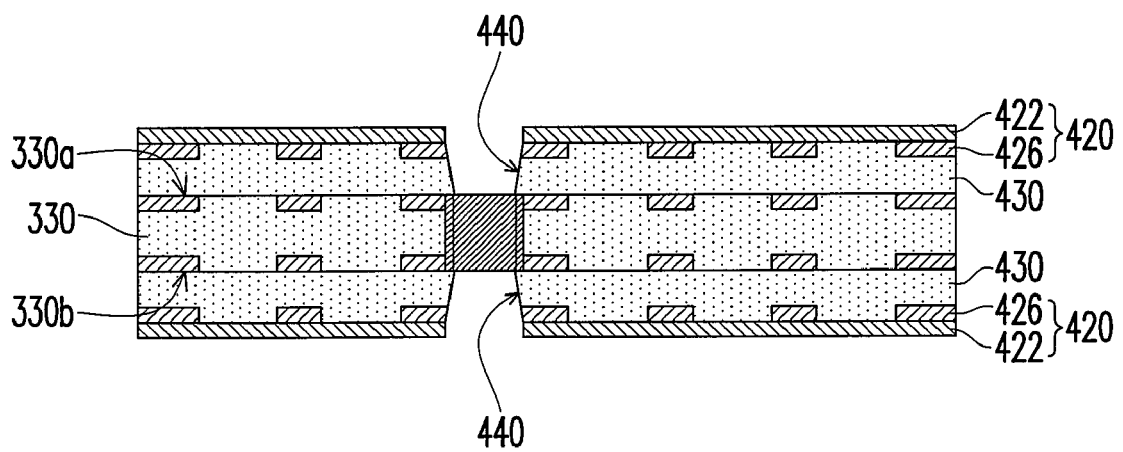

After laminating the second dielectric layer 430 and the second carrier 410 with the third conductive layer 420 on the first dielectric layer 330, the second carriers 410 are removed, as shown in FIG. 4D. Thereafter, as shown in FIG. 4E, the third conductive layer 420 corresponding to a second concave structure 420a is removed to expose a portion of the second dielectric layer 430. Next, the second dielectric layer 430 exposed by the third conductive layer 420 is removed through laser manufacturing or other suitable techniques to form a second opening 440, as shown in FIG. 4F.

Figure 4G:
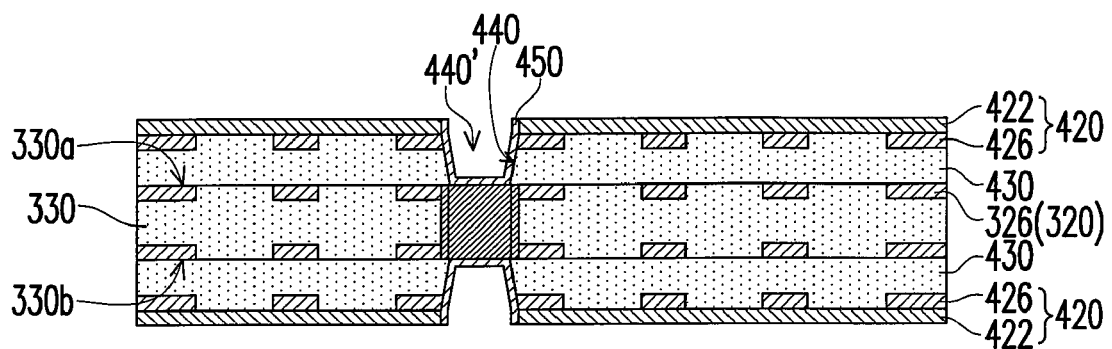

After forming the second opening 440, a fourth conductive layer 450 is then formed on the inner wall of the second opening 440, as shown in FIG. 4G. Thus, the fabrication of the second conductive hole 440' is completed. In the present embodiment, the fourth conductive layer 450 is electrically connected to the first conductive layer 320 (i.e. the first circuit layer 326) embedded in the first dielectric layer 330 and the third conductive layer 420 (i.e. the second circuit layer 426) embedded in the second dielectric layer 430, namely, the first conductive layer 320 can transmit electrical signals to/from the third conductive layer 420 via the second conductive hole 440'. Certainly, in other exemplary embodiments of the present invention, a plurality of second conductive holes 440' may be added according to the design requirement, and the number of the second conductive holes 440' is not limited by the present invention.

Figure 4H:
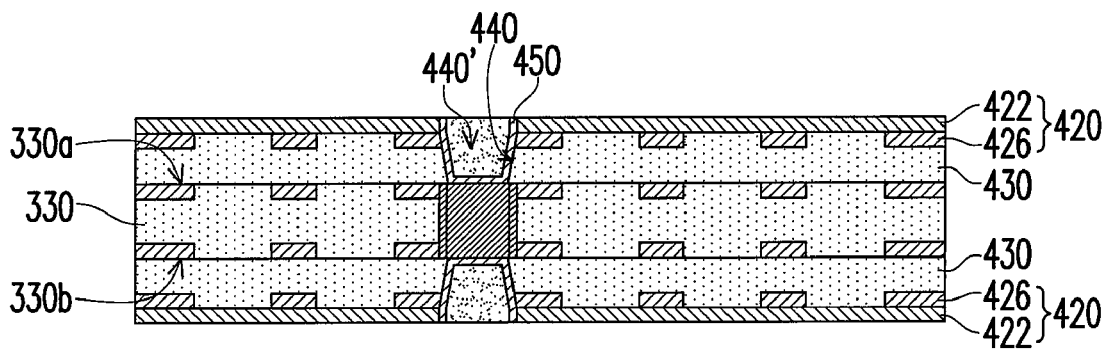
Figure 4I:
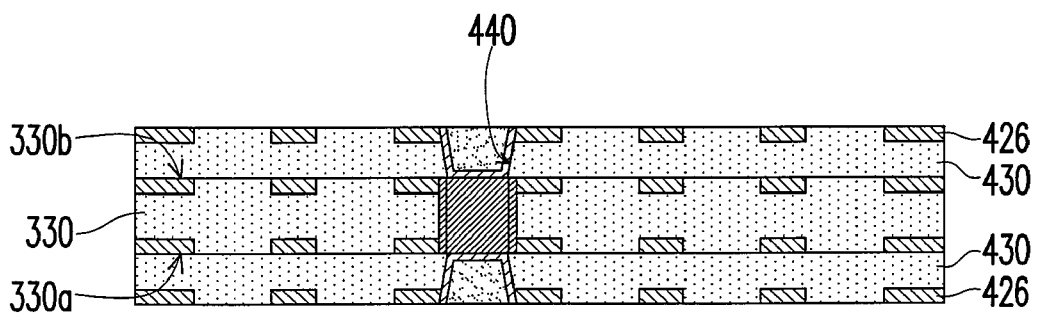

In the present embodiment, after completing the fabrication of the second conductive hole 440', a hole-filling material may be filled in the second opening 440 for preventing popcorn effect, as shown in FIG. 4H. The hole-filling material may be a conductive material (which may be filled in the second opening 440 through hole-filling electroplating, electrolytic deposition, chemical deposition, vapor deposition, sputtering, or other suitable methods) or an insulating material (for example, ink). Next, as shown in FIG. 4I, the third conductive layer 420 (i.e. the second metal layer 422) on the surface of the second dielectric layer 430 and the hole-filling material outside of the second opening 440 are removed. Thus, the fabrication of the four-layer circuit board 400 is completed. The four-layer circuit board 400 is also an embedded circuit board.

In summary, in the circuit board process provided by the present invention, the circuit layer on the circuit board is embedded in the dielectric layer, and the disposition of the conductive hole is defined at the same time while the circuit layer is fabricated. Compared to conventional techniques, the present invention has at least the following advantages.

1. According to the present invention, the circuit layer on the circuit board is embedded in the dielectric layer; therefore the circuit layer and the dielectric layer can be securely bonded together. In other words, the circuit layer in the present invention has high reliability.

2. According to the present invention, the disposition of the conductive hole is defined at the same time while the circuit layer is fabricated; therefore less numbers of alignment processes are required for defining the dispositions of the conductive hole and the circuit layer. Namely, the circuit board in the present invention has high circuit fabrication efficiency.

3. According to the present invention, the disposition of the conductive hole is defined at the same time while the circuit layer is fabricated; therefore the dispositions of the conductive hole and the circuit layer are not affected by process tolerance. To be specific, the conductive hole and the circuit layer can be accurately disposed at the predetermined dispositions thereof.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board process, comprising:
   providing a plurality of first carriers, and forming a first conductive layer on each of the first carriers, wherein the first conductive layer has a plurality of first concave structures;
   providing a first dielectric layer, wherein the first dielectric layer has a first surface and a second surface;
   respectively laminating a first carrier with the first conductive layer formed on the first surface and the second surface of the first dielectric layer, wherein the first conductive layer is located between the first dielectric layer and the respective first carrier, and a portion of the first conductive layer is embedded in the first surface and the second surface of the first dielectric layer;
   removing the first carriers;
   removing the first conductive layer corresponding to at least one of the first concave structures to expose a portion of the first dielectric layer;
   removing the first dielectric layer exposed by the first conductive layer to form a first opening;
   forming a second conductive layer on the inner wall of the first opening, wherein the second conductive layer is electrically connected to the first conductive layers on both sides of the first dielectric layer; and
   removing the first conductive layers on the first surface and the second surface such that a first circuit layer is remained on the first surface and second surface of the first dielectric layer.

2. The circuit board process according to claim 1, wherein the first concave structures comprise annular concave structures.

3. The circuit board process according to claim 1, wherein the step for forming the first conductive layer on the first carrier comprises:
   forming a first metal layer on each of the first carriers;
   forming a first patterned photoresist layer on the first metal layer, wherein the first patterned photoresist layer exposes a portion of the first metal layer;
   forming the first circuit layer on the first metal layer exposed by the first patterned photoresist layer; and
   removing the first patterned photoresist layer to form the first conductive layer, and the first conductive layer comprises the first metal layer and the first circuit layer.

4. The circuit board process according to claim 3, wherein the step for forming the first circuit layer comprises an electroplating process, an electrolytic deposition, a physical deposition, a chemical deposition or a sputtering process.

5. The circuit board process according to claim 3, wherein the step for forming the first patterned photoresist layer comprises an exposure and development process.

6. The circuit board process according to claim 1, wherein the step for forming the first opening comprises laser manufacturing, mechanical drilling, or chemical etching.

7. The circuit board process according to claim 1, wherein after forming the second conductive layer on the inner wall of the first opening, the circuit board process further comprises:
- filling a conductive material in the first opening to form a conductive hole; and
- removing the first conductive layers on the first surface and the second surface and the conductive material outside of the first opening.

8. The circuit board process according to claim 7, wherein after removing the first conductive layers on the first surface and the second surface and the conductive material outside of the first opening, the circuit board process further comprises:
- providing a plurality of second carriers, and forming a third conductive layer on each of the second carriers, wherein the third conductive layer has a plurality of second concave structures;
- respectively laminating a second dielectric layer and a second carrier with the third conductive layer on the first surface and the second surface of the first dielectric layer, wherein each of the second dielectric layers is located between each of the respective second carrier and the first dielectric layer, and a portion of the third conductive layer is embedded in the second dielectric layer;
- removing the second carriers;
- removing the third conductive layer corresponding to at least one of the second concave structures to expose a portion of the second dielectric layer;
- removing the second dielectric layer exposed by each of the third conductive layer to form a second opening;
- forming a fourth conductive layer on the inner wall of each of the second openings, wherein each of the fourth conductive layers is electrically connected to the first conductive layer embedded in the first dielectric layer and the third conductive layer embedded in the second dielectric layer; and
- removing the third conductive layer on each surface of the second dielectric layer such that a second circuit layer is remained on each surface of the second dielectric layer.

9. The circuit board process according to claim 8, wherein the step for forming the second opening comprises a laser manufacturing, a mechanical drilling, or a chemical etching process.

10. The circuit board process according to claim 8, wherein after forming the fourth conductive layer on the inner wall of the second opening, the circuit board process further comprises:
- filling a hole-filling material in the second opening; and
- removing the second conductive layer on each surface of the second dielectric layer and the hole-filling material outside of the second opening.

11. The circuit board process according to claim 8, wherein the hole-filling material includes a conductive material or an insulating material.

12. The circuit board process according to claim 8, wherein the second concave structures are annular concave structures.

* * * * *